United States Patent
Gill

(10) Patent No.: US 7,916,435 B1
(45) Date of Patent: Mar. 29, 2011

(54) MAGNETIC TUNNEL TRANSISTOR HAVING A BASE STRUCTURE THAT PROVIDES POLARIZATION OF UNPOLARIZED ELECTRONS FROM AN EMITTER BASED UPON A MAGNETIC ORIENTATION OF A FREE LAYER AND A SELF-PINNED LAYER

(75) Inventor: Hardayal Singh Gill, Palo Alto, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 834 days.

(21) Appl. No.: 11/760,911

(22) Filed: Jun. 11, 2007

Related U.S. Application Data

(63) Continuation-in-part of application No. 10/428,474, filed on May 2, 2003, now Pat. No. 7,230,804.

(51) Int. Cl.
*G11B 5/33* (2006.01)

(52) U.S. Cl. .................................................. 360/324.2

(58) Field of Classification Search .............. 360/324.2
See application file for complete search history.

(56) References Cited

U.S. PATENT DOCUMENTS

| | | | |
|---|---|---|---|
| 4,847,666 A | 7/1989 | Heremans et al. ............... 257/26 |
| 5,206,590 A | 4/1993 | Dieny et al. .................... 324/252 |
| 5,390,061 A | 2/1995 | Nakatani et al. ............ 360/324.2 |
| 5,521,500 A | 5/1996 | Schuhl et al. ................. 324/249 |
| 5,747,859 A | 5/1998 | Mizushima et al. .......... 257/421 |
| 5,757,056 A | 5/1998 | Chui ............................... 257/421 |
| 5,962,905 A | 10/1999 | Kamiguchi et al. .......... 257/421 |
| 6,052,263 A | 4/2000 | Gill .......................... 360/324.11 |
| 6,069,820 A | 5/2000 | Inomata et al. ............... 365/171 |
| 6,072,718 A | 6/2000 | Abraham et al. ............. 365/173 |
| 6,124,711 A | 9/2000 | Tanaka et al. ................. 324/252 |
| 6,165,287 A | 12/2000 | Sato et al. ...................... 148/276 |
| 6,191,926 B1 | 2/2001 | Everitt et al. ............ 360/324.11 |
| 6,219,208 B1 | 4/2001 | Gill .............................. 360/324.1 |
| 6,396,734 B2 | 5/2002 | Ishikawa et al. .............. 365/158 |
| 6,480,365 B1 | 11/2002 | Gill et al. .................. 360/324.11 |
| 6,636,398 B2 | 10/2003 | Sasaki et al. ................ 360/324.1 |
| 6,781,798 B2 * | 8/2004 | Gill ............................... 360/314 |
| 6,919,608 B2 | 7/2005 | Gregg ........................... 257/423 |
| 7,016,167 B2 | 3/2006 | Fontana, Jr. et al. ...... 360/324.12 |
| 7,230,804 B2 * | 6/2007 | Gill .............................. 360/324.2 |
| 2002/0024780 A1 | 2/2002 | Mao et al. ................. 360/324.11 |
| 2002/0044398 A1 | 4/2002 | Sasaki et al. ............. 360/324.12 |
| 2002/0064595 A1 | 5/2002 | Nomura et al. ............... 427/131 |
| 2005/0017314 A1 * | 1/2005 | Gill ............................... 257/421 |
| 2006/0152860 A1 * | 7/2006 | Childress et al. .......... 360/324.2 |

* cited by examiner

*Primary Examiner* — Julie Anne Watko
(74) *Attorney, Agent, or Firm* — Merchant & Gould

(57) ABSTRACT

A magnetic tunnel transistor (MTT) is formed having an emitter that is configured to provide unpolarized electrons. A composite base is configured to provide polarization of the unpolarized electrons injected into the base by the emitter based upon a magnetic orientation of the free layer and the self-pinned layer of the base.

14 Claims, 8 Drawing Sheets

MAGNETIC TUNNEL TRANSISTOR HAVING A BASE STRUCTURE THAT PROVIDES POLARIZATION OF UNPOLARIZED ELECTRONS FROM AN EMITTER BASED UPON A MAGNETIC ORIENTATION OF A FREE LAYER AND A SELF-PINNED LAYER

RELATED APPLICATION

This application is a continuation-in-part of U.S. application Ser. No. 10/428,474, filed May 2, 2003, which is hereby incorporated by reference.

BACKGROUND OF THE INVENTION

1. Field of the Invention

The present invention relates in general to magnetic heads for magnetic storage systems and more particularly to a magnetic tunnel transistor having a bottom collector and self-pinned spin-valve providing an enhanced magnetocurrent ratio.

2. Description of Related Art

Magnetic recording is a key and invaluable segment of the information-processing industry. While the basic principles are one hundred years old for early tape devices, and over forty years old for magnetic hard disk drives, an influx of technical innovations continues to extend the storage capacity and performance of magnetic recording products.

For hard disk drives, the areal density or density of written data bits on the magnetic medium has increased by a factor of more than two million since the first disk drive was applied to data storage. Areal density continues to grow due to improvements in magnet recording heads, media, drive electronics, and mechanics.

Magnetic recording media increasingly decreases in size while increasing capacity. One reason for the increase capacity and reduced size is the giant magnetoresistive head (GMR). A GMR head includes a spin-valve film that provides a high magnetoresistance ratio (MR ratio) as compared with a conventional MR head. The MR ratio is the percentage change in resistance as an external magnetic field is switched between high and low values.

The spin-valve film, or spin-valve transistor, may also be used in other devices, such as magnetic memory (MRAM), to permit substantially infinite rewrite operations with low power consumption. However, even though spin-valve transistors are known to exhibit an extremely high MR ratio of several hundreds percent at certain temperatures, conventional spin-valve transistors have a defect in that a collector current ($I_C$) is extremely low. For example, the collector current ($I_C$) is about $10^{-4}$ of the emitter current ($I_E$).

One reason for the low collector current level is because of electron scattering. The spin-valve transistor is designed to operate based on spin-dependent scattering of electrons. This means that the manner of electron scattering changes depending on whether the spin directions of electrons are parallel (i.e., spin direction of electrons are aligned with a spin direction of atoms in a magnetic layer) or anti-parallel in the two magnetic films of a spin-valve film included in a base of the spin-valve transistor. More specifically, when electrons flow through a conductor, about half are in a state called spin-down, and the others are in a spin-up state. Electrons with spins parallel to the spins of atoms on a magnetic layer of the spin-valve are less likely to be scattered than those with the opposite spin. Accordingly, in a spin-valve, due to the magnetic orientation of the layers, electrons are scattered and less current flows through each layer. However, a magnetic field, such as one from data encoded in a disk drive's recording medium, may reorient the spins on the atoms of the spin-valve to allow more current to pass through the spin-valve.

Also, in the spin-valve transistor, diffusive scattering occurs within a magnetic layer or at the interface between the magnetic layer and a nonmagnetic layer. Nevertheless, since the scattered electrons are incapable of flowing into the collector due to a strong diffraction effect at the interface between the base and the collector, the collector current is decreased.

Another reason for a small collector current is because of limited collection efficiency due to a small difference between two Schottky barrier heights. For example, a typical spin-valve transistor may include a FeCo/Au/Co spin-valve sandwiched between two Si wafers. Additionally, Pt layers are incorporated defining the emitter and collector Schottky diodes. The resulting Si—Pt Schottky barriers at emitter and collector sides have a barrier height of 0.85 eV and 0.81 eV, respectively (due to the different method of preparation of the Schottky diodes at emitter and collector side).

When the emitter Schottky barrier is forward biased, hot electrons are injected into the spin-valve. Hot electrons are electrons (i.e., carriers) with energies far above the Fermi level whereby the Fermi level is used to describe the highest of a collection of electron energy levels at a specified temperature. After the hot electrons traverse the spin-valve, these hot electrons are collected according to their energy and momentum at the Si—Pt collector Schottky barrier. Only a few injected hot electrons are typically collected. These few hot electrons have retained enough energy to surmount the Schottky barrier at the collector, which, as discussed above, is only slightly lower than the emitter barrier (i.e., 0.81 eV at the collector as compared to 0.85 eV at the emitter). The resulting low transfer ratio of collector current-to-emitter current ($I_C/I_E$) in the spin-valve transistor is undesirable in view of power consumption, operating speed, noise, etc.

An alternative sensing device is a magnetic tunnel transistor (MTT). A magnetic tunnel transistor (MTT) includes a ferromagnetic (FM) emitter, such as cobalt Iron (CoFe), a tunnel barrier, a single ultra thin FM base layer, and a collector such as GaAs. The emitter is pinned in the base by a thick adjacent anti-ferromagnetic (AFM) layer such as iridium manganese (IrMn) or platinum manganese (PtMn). When the emitter is pinned by the thick AMF pinning layer, electrons passing through the pinned emitter become polarized (i.e., orienting the direction of the spin of an electron either up or down) to increase the transfer ratio ($I_C/I_E$).

However, the thick AFM layer increases a series resistance in the emitter and hence decreases the current that can pass through the emitter to the collector. Also, when a magnetic tunnel transistor is operating at high temperatures, the manganese has a tendency to diffuse into the tunnel barrier layer and degrade the performance of the transistor by affecting the electrons traveling through the tunnel barrier layer. Further, AFM materials have a blocking temperature, and when an AFM material exceeds the blocking temperature (e.g., the MTT is operating at high temperatures) the AFM material loses its pinning and becomes disorientated. Hence, if the emitter becomes disorientated and the electrons flowing through the emitter are no longer polarized, the performance of the magnetic tunnel transistor is degraded.

It can be seen that there is a need for a method and apparatus for providing a magnetic tunnel transistor having a bottom collector and self-pinned spin-valve providing an enhanced magnetocurrent ratio.

SUMMARY OF THE INVENTION

To overcome the limitations in the prior art described above, and to overcome other limitations that will become apparent upon reading and understanding the present specification, embodiments of the present invention include a method and apparatus for providing a magnetic tunnel transistor having a bottom collector and self-pinned spin-valve providing an enhanced magnetocurrent ratio.

The embodiments of the present invention solve the above-described problems by decreasing resistance in a self-pinned emitter by eliminating a thick resistive adjacent anti-ferromagnetic pinning layer. An easier manufacturing process is provided because the semiconductor material of the collector may be formed on the bottom first as it requires a high temperature fabrication process that degrades properties of the magnetic layers of a magnetic tunnel transistor. The large polarization of transmitted electrons provides a large magnetocurrent ratio.

An embodiment of the present invention includes a magnetic tunnel transistor sensor is provided. The magnetic tunnel transistor sensor includes a bottom collector, a composite base structure formed on the collector, the composite base comprising a spin valve including a self-pinned layer, a free layer and a spacer layer disposed between the free layer and the pinned layer, a tunnel barrier layer formed on the composite base structure and an emitter formed on the tunnel barrier layer, wherein the emitter provides unpolarized electrons and the composite base structure provides polarization of unpolarized electrons from the emitter based upon a magnetic orientation of the free layer and the self-pinned layer.

In another embodiment of the present invention, a magnetic storage system is provided. The magnetic storage system includes a movable magnetic recording medium, a magnetic tunnel transistor sensor for detecting magnetic signals on the moveable recording medium and an actuator, coupled to the magnetic tunnel transistor sensor, for moving the sensor relative to the medium, wherein the magnetic tunnel transistor sensor further includes a bottom collector, a composite base structure formed on the collector, the composite base comprising a spin valve including a self-pinned layer, a free layer and a spacer layer disposed between the free layer and the pinned layer, a tunnel barrier layer formed on the composite base structure and an emitter formed on the tunnel barrier layer, wherein the emitter provides unpolarized electrons and the composite base structure provides polarization of unpolarized electrons from the emitter based upon a magnetic orientation of the free layer and the self-pinned layer.

In another embodiment of the present invention, a method of forming a magnetic tunnel transistor is provided. The method includes forming a bottom collector, forming a composite base structure on the collector, wherein the forming the composite base structure further comprises forming a spin valve including a self-pinned layer, a free layer and a spacer layer disposed between the free layer and the pinned layer, forming a tunnel barrier layer on the composite base structure and forming an emitter on the tunnel barrier layer for providing unpolarized electrons to the composite base structure for polarization of unpolarized electrons by the composite base structure based upon a magnetic orientation of the free layer and the self-pinned layer.

These and various other advantages and features of novelty which characterize the embodiments of the present invention are pointed out with particularity in the claims annexed hereto and form a part hereof. However, for a better understanding of the embodiments of the present invention, their advantages, and the objects obtained by their use, reference should be made to the drawings which form a further part hereof, and to accompanying descriptive matter, in which there are illustrated and described specific embodiments of the present invention.

BRIEF DESCRIPTION OF THE DRAWINGS

Referring now to the drawings in which like reference numbers represent corresponding parts throughout.

DETAILED DESCRIPTION OF THE INVENTION

In the following description of the embodiments, reference is made to the accompanying drawings that form a part hereof, and in which is shown by way of illustration the specific embodiments in which the invention may be practiced. It is to be understood that other embodiments may be utilized because structural changes may be made without departing from the scope of the embodiments of the present invention.

Embodiments of the present invention provide a method and apparatus for providing a magnetic tunnel transistor having a bottom collector and self-pinned spin-valve providing an enhanced magnetocurrent ratio. Resistance in a self-pinned emitter is lowered by eliminating a thick resistive adjacent anti-ferromagnetic pinning layer. An easier manufacturing process is provided because the semiconductor material of the collector may be formed on the bottom first as it requires a high temperature fabrication process that degrades properties of the magnetic layers of a magnetic tunnel transistor. The large polarization of transmitted electrons provides a large magnetocurrent ratio.

Figure 1:
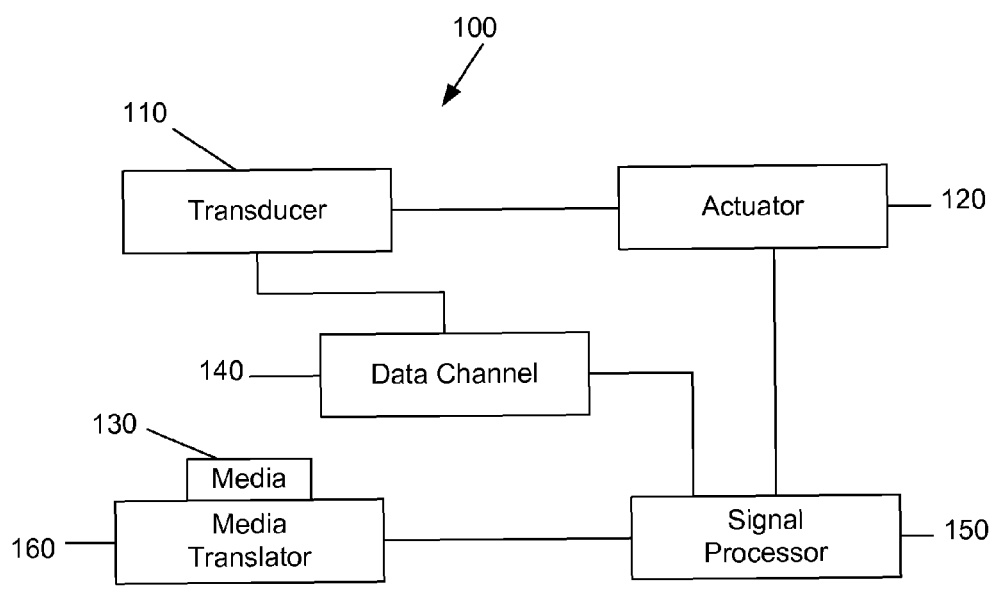
FIG. 1 illustrates a storage system according to the present invention.

FIG. 1 illustrates a storage system 100. In FIG. 1, a transducer 110 is under control of an actuator 120. The actuator 120 controls the position of the transducer 110. The transducer 110 writes and reads data on magnetic media 130. The read/write signals are passed to a data channel 140. A signal processor 150 controls the actuator 120 and processes the signals of the data channel 140. In addition, a media translator 160 is controlled by the signal processor 150 to cause the magnetic media 130 to move relative to the transducer 110. The present invention is not meant to be limited to a particular type of storage system 100 or to the type of media 130 used in the storage system 100.

Figure 2:
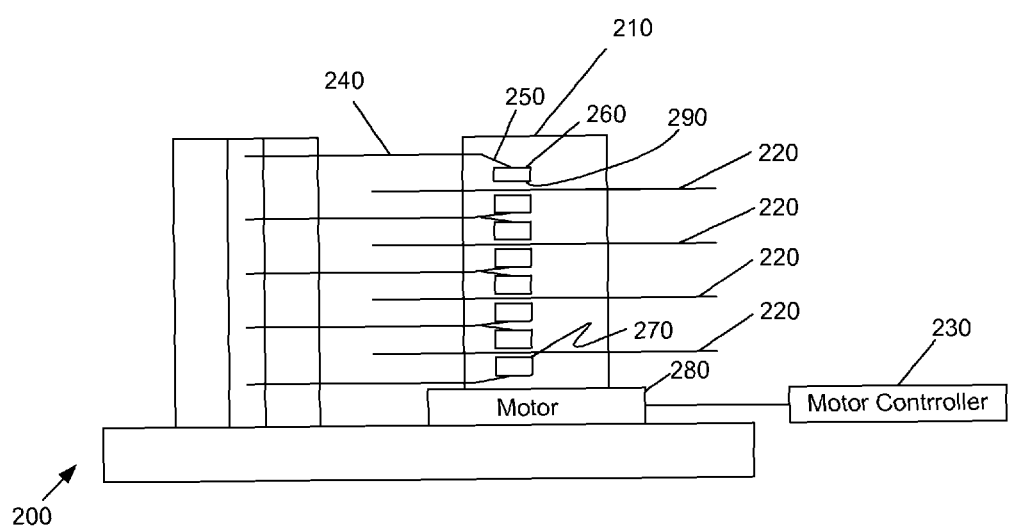
FIG. 2 illustrates one particular embodiment of a storage system according to the present invention.

FIG. 2 illustrates one particular embodiment of a storage system 200 according to the present invention. In FIG. 2, a hard disk drive storage system 200 is shown. The system 200 includes a spindle 210 that supports and rotates multiple magnetic disks 220. The spindle 210 is rotated by motor 280 that is controlled by motor controller 230. A combined read and write magnetic head 270 is mounted on slider 260 that is supported by suspension 250 and actuator arm 240. Processing circuitry exchanges signals that represent information with read/write magnetic head 270, provides motor drive signals for rotating the magnetic disks 220, and provides control signals for moving the slider 260 to various tracks. Although a multiple magnetic disk storage system is illustrated, a single magnetic disk storage system is equally viable in accordance with the present invention.

The suspension 250 and actuator arm 240 positions the slider 260 so that read/write magnetic head 270 is in a transducing relationship with a surface of magnetic disk 220. When motor 280 rotate the magnetic disk 220, the slider 240 is supported on a thin cushion of air (air bearing) between the surface of disk 220 and the ABS 290. Read/write magnetic head 270 may then be employed for writing information to multiple circular tracks on the surface of magnetic disk 220, as well as for reading information therefrom.

Figure 3:
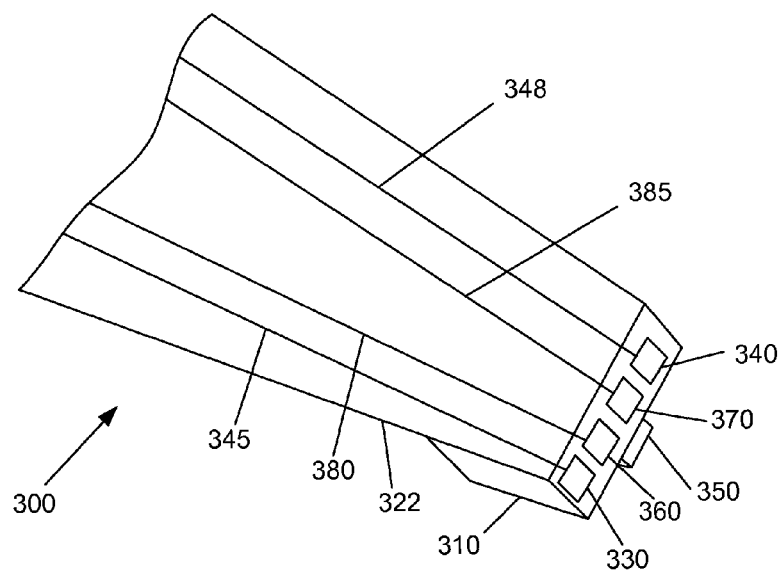
FIG. 3 illustrates a suspension structure for a magnetic head.

FIG. 3 illustrates a suspension structure 300 for a magnetic head. A slider 310 mounted on a suspension 322. First and second solder connections 330 and 340 connect leads from the sensor 350 to leads 345 and 348, respectively, on suspension 322 and third and fourth solder connections 360 and 370 connect to the write coil (not shown) to leads 380 and 385, respectively, on suspension 322.

Figure 4:
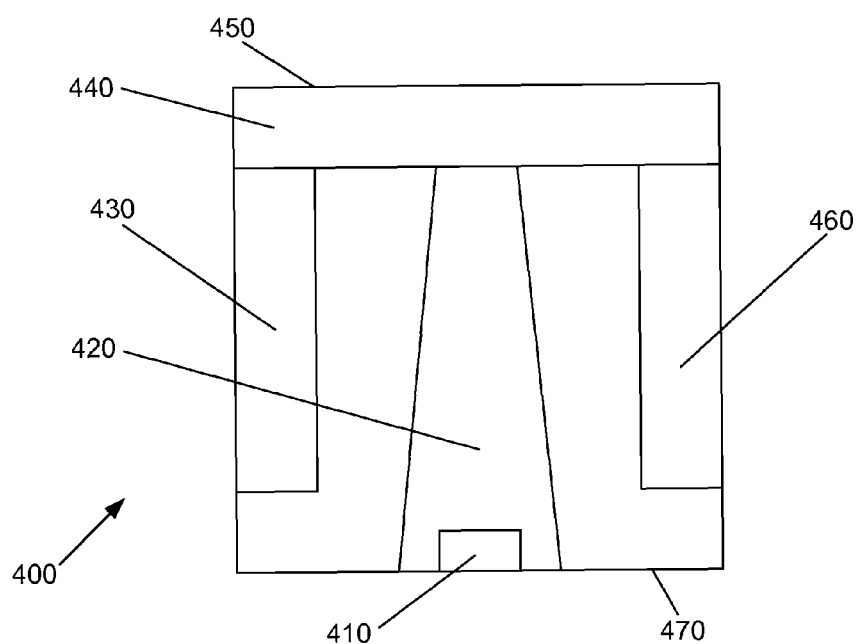
FIG. 4 illustrates an ABS view of the slider and the magnetic head.

FIG. 4 is an ABS view of slider 400 and magnetic head 410. The slider has a center rail 420 that supports the magnetic head 410, and side rails 430 and 460. The support rails 420, 430 and 460 extend from a cross rail 440. With respect to rotation of a magnetic disk, the cross rail 440 is at a leading edge 450 of slider 400 and the magnetic head 410 is at a trailing edge 470 of slider 400.

The above description of magnetic storage systems, shown in the accompanying FIGS. 1-4, are for presentation purposes only and the present invention is not meant to be limited to the magnetic storage systems illustrated therein. For example, magnetic storage systems may contain a plurality of recording media, such as magnetic tape, and actuators, and each actuator may support a number of sliders. In addition, instead of an air-bearing slider, the head carrier may be one that maintains the head in contact or near contact with the medium, such as in liquid bearing and other contact and near-contact recording devices.

Figure 5:
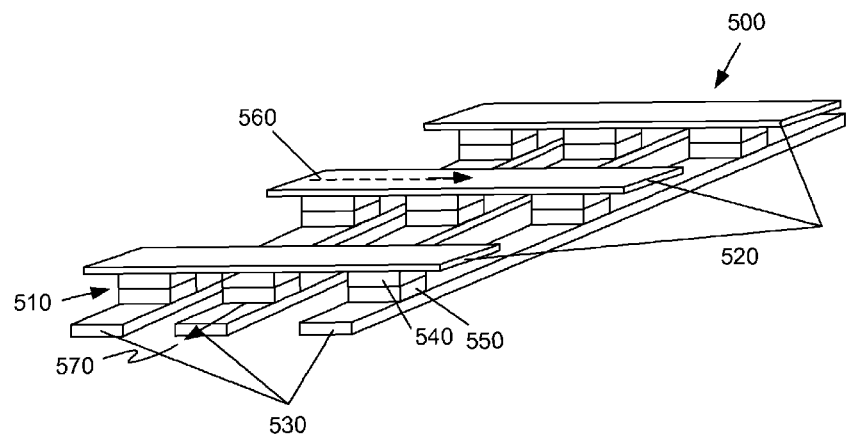
FIG. 5 illustrates one embodiment of a memory device.

FIG. 5 illustrates one embodiment of a memory device 500. One type of memory device 500 is a magnetic-random-access memory (MRAM). MRAM may have at least two magnetically stable states that can be written to and read from electronically. A memory device 500, such as MRAM, may be a solid-state non-volatile magnetic storage device in which each bit of data is stored in a magnetoresistive element 510. This non-volatility combined with a non-destructive readout, low power consumption, high packaging density, and a fast read and write access times to a memory location is a advantage over static RAM, dynamic RAM and flash memory because data doesn't have to be continuously refreshed to the solid-state storage devices.

Solid-state MRAM may use anisotropic magnetoresistance (AMR) films (i.e., a device that changes its resistance with an applied magnetic field) as the magnetoresistive element 510. The larger the magnetoresistive (MR) response (e.g., a response from a giant magnetoresistance (GMR) film), the more commercially viable the MRAM becomes. However, packaging of the MRAM using a GMR film is not as efficient as, for example, the packaging of magnetic tunnel junctions (MTJs) of magnetic tunnel transistors (MTTs). The magnetic tunnel junctions of magnetic tunnel transistors provide high packing density by using a cross-point architecture (520, 530).

One possible embodiment of an MRAM structure consists of an array of parallel sense lines 520 and parallel word lines 530. At each junction of the parallel sense lines 520 and parallel word lines 530 is a magnetoresistive element 510. The magnetoresistive element 510 may consist of two magnetic layers of different coercivity, one hard 540 and one soft 550. Magnetic fields generated by currents 560, 570 passing simultaneously through a sense line 520 and a word line 530 provides writing to an element 510 at the intersection of the two lines 520, 530. The detection of resistance changes in a sense line 520 caused by a smaller measured current 570 in the word line 530 provides a reading of the element 510.

More particularly, the direction of magnetization of the hard layer 540 is used to represent the data bit. To write data, a magnetic field is applied by passing a current 570 through a conductor line (word line 530) adjacent to the element 510 such that the field is large enough to change the magnetization of the hard layer 540. To read, a smaller current is passed, which can change the magnetization of the soft layer 550 only. The resistance of the element depends on whether the hard 540 and soft 550 layers are magnetized parallel or antiparallel. Hence, changes in the resistance resulting from the reversal of the soft layer 550 can be used to probe the magnetic state of the hard layer 540.

Figure 6:
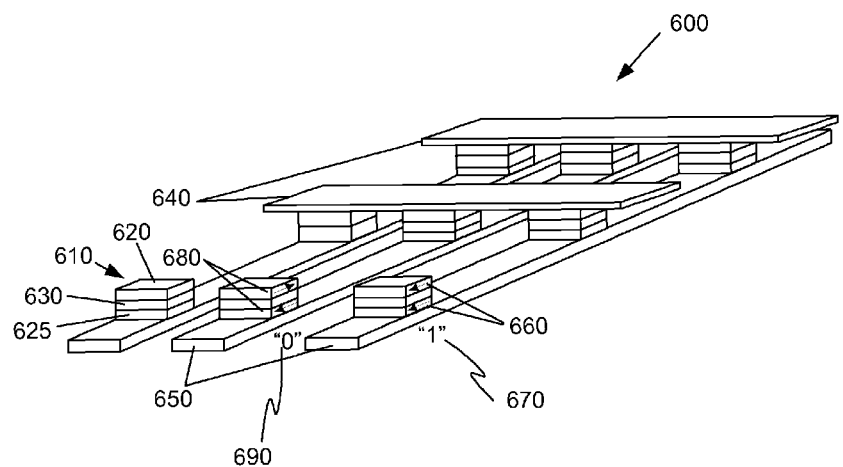
FIG. 6 illustrates the operation of a memory device using a magnetic tunnel junction of a magnetic tunnel transistor.

FIG. 6 illustrates the operation of a memory device 600 using a magnetic tunnel junction. A magnetic tunnel junction (MTJ) 610, and hence, a magnetic tunnel transistor (MTT), may be utilize in a memory device such as in magnetic RAM (MRAM) and also in magnetic disk drive and magnetic tape drive devices. The design in FIG. 6 uses a magnetic tunnel junction cell 610 consisting of two magnetic layers 620, 625 separated by a thin insulating barrier layer 630. The magnetic tunnel junction 610 is disposed at the intersection of sense lines 640 and word lines 650. A first layer 620, for example, polarizes the spins of current-carrying electrons, which cross the barrier 630 to, for example, a second layer 625 by quantum tunneling when both layers are aligned 660 to produce, for example, a one bit ("1") 670. When the magnetism of the second ferromagnetic layer is reversed 680, the tunneling is reduced and a zero bit ("0") 690 may be produce.

This tunnel junction device may require a MTT to select each bit for reading and writing. However, the large magnetoresistance allows the tunnel junction 610 to be implemented in high-performance memory devices 600, such as MRAM devices.

Figure 7:
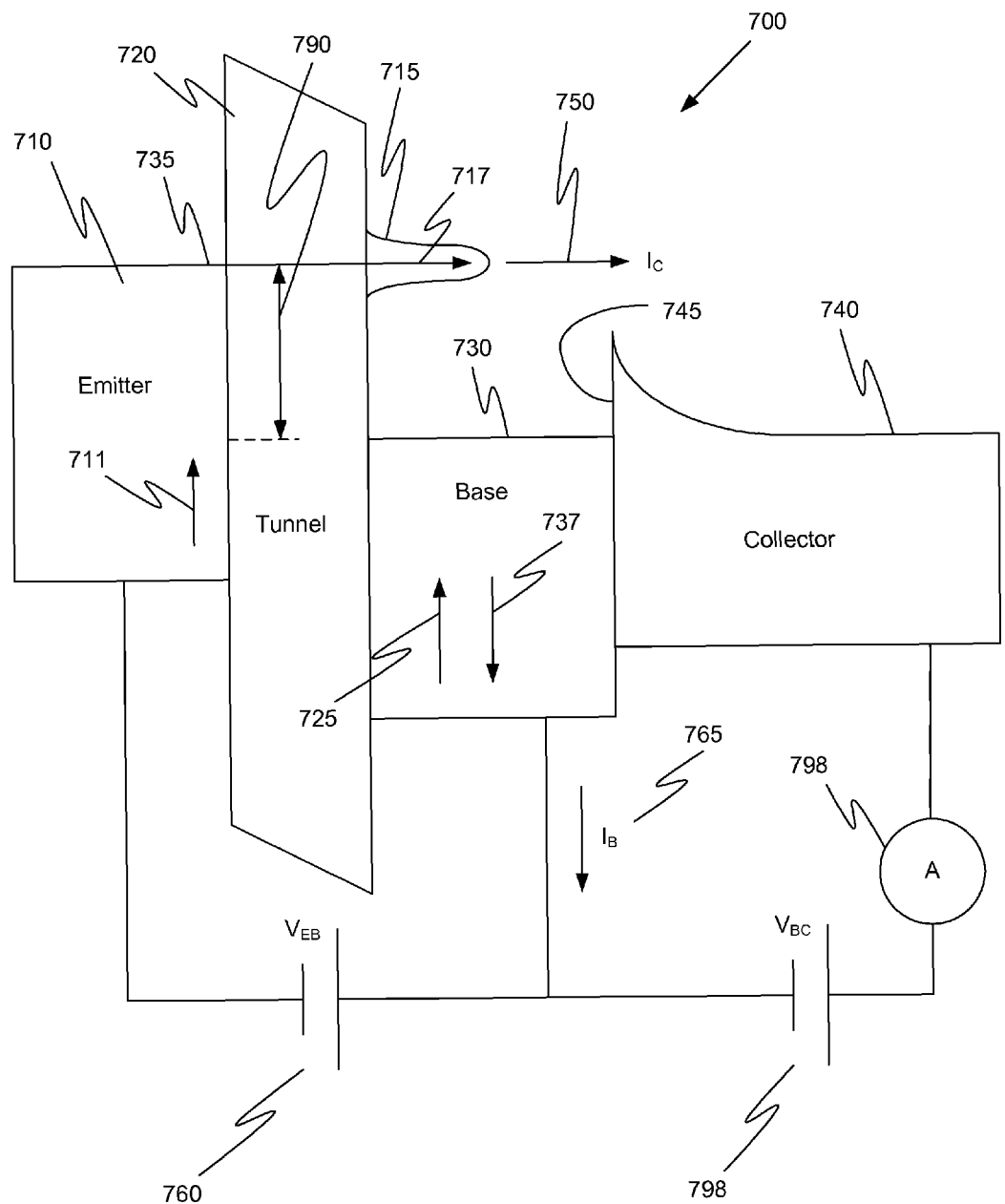
FIG. 7 illustrates an energy diagram of a magnetic tunnel transistor (MTT)

FIG. 7 illustrates an energy diagram 700 of a magnetic tunnel transistor (MTT). The MTT consists of a ferromagnetic (FM) emitter 710 such as CoFe, a tunnel barrier 720 such as $Al_2O_3$, a single ultra thin FM base layer 730 such as CoFe, and a collector 740 such as GaAs. The emitter 710 spin-polarizes electrons 715 and hence spin-polarized electron current 717 is injected from the emitter 710 into the base 730 via the tunnel barrier 720. The spin-polarized electrons are further spin filtered by spin-dependent scattering in the FM base layer 730.

In normal operation of the magnetic tunnel transistor 700, the emitter 710 is forward biased 760 causing a current of hot electrons 715 to go over the a first predetermined barrier level 790; hot electrons at the predetermined barrier level 790 surmount an emitter/barrier interface 735, such as a Schottky barrier. The hot electrons 715 are injected through the tunnel barrier 720 into the base 730. The hot electrons 715 have a certain energy and momentum dictated by a choice of metal/semiconductor used at the emitter/barrier interface 735. The hot electrons travel through the tunnel 720 and encounter a second barrier 745, such as a Schottky barrier. This barrier 745 can only be crossed by electrons that have energy higher than the barrier 745 and a momentum that fits an available state in the semiconductor/metal interface between the base 730 and the collector 740.

Hence, the electrons 715 having the high energy and momentum will contribute to the collector current 750. All other electrons that have lost their energy or are scattered in the base layer 730 will thermalize and contribute to the base current ($I_B$) 765.

The collector current 750, as measured by a current measuring device 798, depends critically on the orientation of a magnetic moment 725 or 737 of the base 730 with respect to a magnetic moment 711 of the emitter 710. For clarity, majority spin electrons are those electrons in a magnetic material that have their spin aligned with the magnetization (low scattering rate) and minority spin electrons are those electrons with their spin opposite to the magnetization (high scattering rate). As a consequence, in a parallel configuration as represented by moments 711, 725, most of the injected electrons 715 enter the base 730 as majority electrons. These majority electrons have a low scattering probability and as a result, a high collector current 750 may be measured.

In an anti-parallel configuration 711, 735 most electrons 715 are injected as minority electrons, these minority electrons have a high scattering probability and will thus thermalize in the base 730 and contribute to the base current 765. Only a very small number of majority electrons will enter the collector 740 resulting in a low collector current 750.

An enhanced output collector current 750 can, for example, be obtained by further increasing the applied voltage across the tunnel barrier 720. However, this increased voltage would require tunnel barriers 720 with higher breakdown voltages. A spin-valve structure could also be used in the base 730 to provide a greater magnetocurrent (MC—the change in collector current). However, the disadvantage of a multilayer base as found in a spin-valve structure is a decrease in the output current 750 because of the increase in series resistance due to the multiple layers of the spin-valve. Hence, one way to improve the collector current 750 while maintaining high magnetocurrent values is reducing spin-independent scattering and the thickness of the base layer 730.

Figure 8:
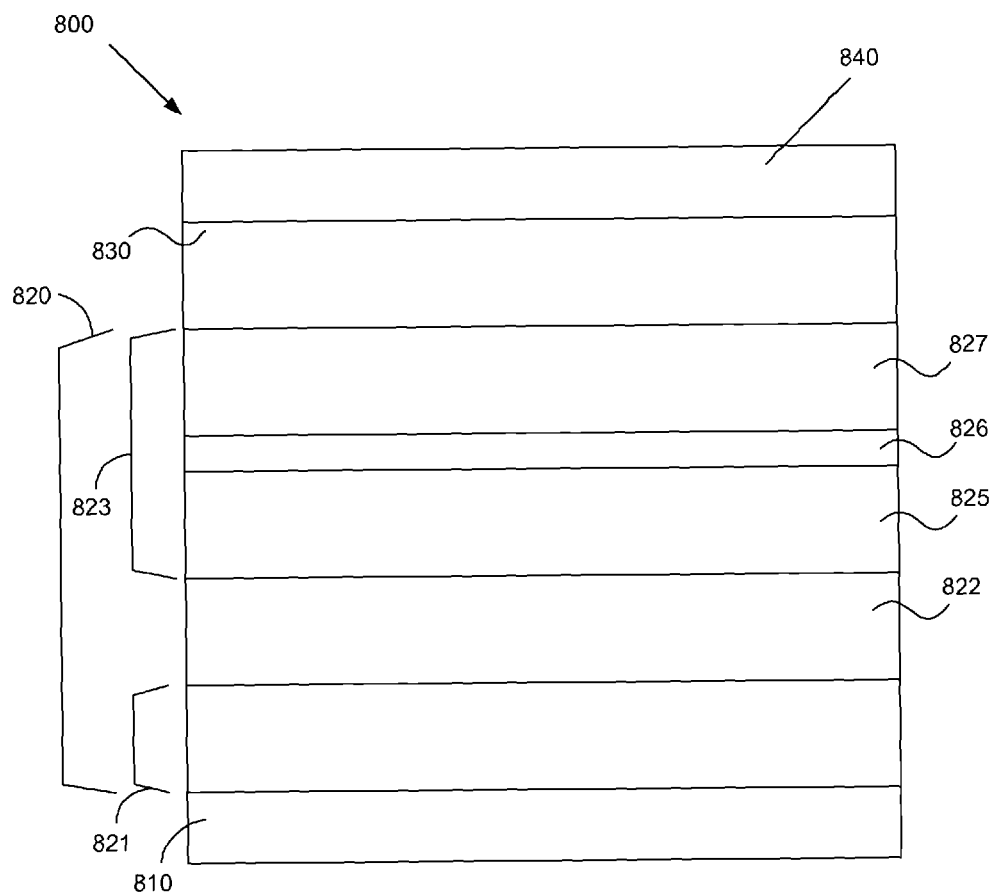
FIG. 8 illustrates a magnetic tunnel transistor with a base layer having a reduced thickness and a self-pinned emitter according to the present invention.

FIG. 8 illustrates a magnetic tunnel transistor 800 with a base layer having a reduced thickness and a self-pinned emitter according to the present invention. In a self-pinned device, the magnetic moment of the pinned layer may be pinned in the fabrication process; i.e., the magnetic moment is set by the specific thickness and composition of the film. It is noteworthy that a self-pinned magnetic tunnel transistor requires no additional external layers applied adjacent thereto to maintain a desired magnetic orientation and, therefore, is considered to be an improvement over the anti-ferromagnetically pinned magnetic tunnel transistor.

In FIG. 8, the magnetic tunnel transistor 800 includes a bottom collector 810. A base layer 820 is formed on the collector 810. The base layer 820 includes a spin valve formed by a self-pinned layer 821, a spacer 822 and a composite free layer 823. A tunnel barrier layer 830 is formed over the base 820 and an emitter layer 840 is formed over the tunnel barrier layer 830.

In one embodiment of the present invention, the free layer 823 includes a first CoFe layer 825, a ruthenium spacer layer 826 and a second CoFe layer 827. The two ferromagnetic films 825, 827 making up the free layer 823 are anti-ferromagnetically coupled to one another by means of the appropriate type and thickness of the anti-ferromagnetic coupling film 826 so that the magnetizations of the two ferromagnetic films 825, 827 are oriented anti-parallel to one another. Barrier layer 830 may be an $Al_2O_3$ layer. The self-pinned layer 821 may be a NiFe/CoFe layer. However, the invention is not limited to these materials and other materials are possible for use to achieve a high pinning strength.

In operation, unpolarized electrons are injected across the tunnel barrier 830. The high transmission polarization is achieved in the base layer 820 by the combination of the self-pinned layer 821 and the free layer 823 separated by the spacer layer 822. The magnetic orientations of the layers within the base layer 820 achieve large polarization of electrons that are transmitted across the tunnel barrier 830. The collector current, $I_C$, depends on relative alignment of moments of free layer 823 and self-pinned layer 821 of base 820. When the moments of free layer 823 and self-pinned layer 821 of base 820 are aligned parallel 860, the collector current is very large as compared to the collector current when the moments of free layer 823 and self-pinned layer 821 of base 820 are aligned anti-parallel 870. The magnetocurrent ratio of the collector current may be approximately 3000-4000, i.e., the collector current when the moments are aligned parallel 860 is 3000-4000% greater than the collector current when the moments are not aligned parallel 870.

As discussed above, high pinning strength is required to maintain a first magnetic orientation (FIG. 7, 715) allowing the pinned layer 821 to be substantially constant while being exposed to non-magnetizing effects. Such increased pinning strength are effective to, among other features, increase the dynamic range of the magnetic tunnel transistor effect, i.e., the magnitude of the change in resistivity of magnetic tunnel transistor 800. Also, the self-pinning field of pinned layer 821 should be greater than any demagnetizing fields at an operating temperature of the magnetic tunnel transistor 800 to insure that the magnetization direction (FIG. 7, 715) of self-pinned layer 821 remains fixed during the application of the external signal fields.

As mentioned, the collector 810 is formed on the bottom of the magnetic tunnel transistor 800 to provide the advantage of an easier manufacturing process. The collector 810 may be formed on the bottom first as it requires a high temperature fabrication process that degrades properties of the magnetic layers of a magnetic tunnel transistor. The base 820 thus requires no additional external layers applied adjacent thereto to maintain a desired magnetic orientation and, thus, is an improvement over an anti-ferromagnetically pinned device because the base 820 does not have the added resistance produced by an adjacent anti-ferromagnetically. Accordingly, the structure of the magnetic tunnel transistor 800 eliminates the need for a thick AFM pinning layer in the base 820, increases the ease of manufacturing and provides larger magnetocurrent ratios.

Figure 9:
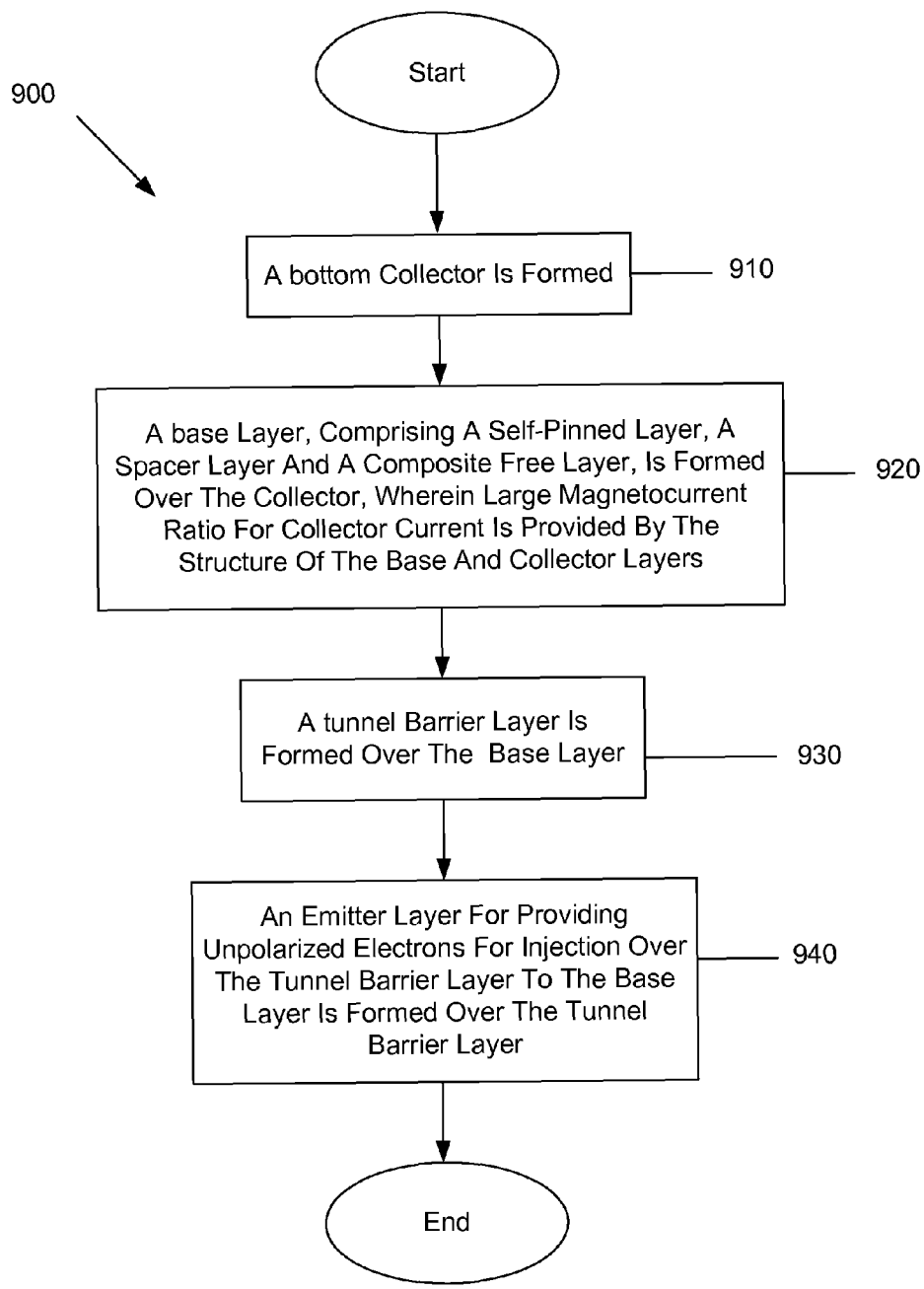
FIG. 9 is a flow chart illustrating the formation of a magnetic tunnel transistor with a self-pinned emitter according to the present invention.

FIG. 9 is a flow chart 900 illustrating the formation of a magnetic tunnel transistor with a self-pinned emitter according to the present invention. The formation of a magnetic tunnel transistor includes forming a bottom collector layer 910. A base layer, comprising a self-pinned layer, a spacer layer and a composite free layer, is formed over the collector, wherein large magnetocurrent ratio for collector current is provided by the structure of the base and collector layers 920. A tunnel barrier layer is formed over the base layer 930. An emitter layer for transmitting unpolarized electrons to the base layer is formed over the tunnel barrier layer 940.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A magnetic tunnel transistor sensor comprising:
a bottom collector;
a composite base structure formed on the collector, the composite base comprising a spin valve including a self-pinned layer, a free layer and a spacer layer disposed between the free layer and the self-pinned layer;
a tunnel barrier layer formed on the composite base structure; and
a self-pinned emitter formed on the tunnel barrier layer, the emitter having a predetermined thickness and composition, wherein the magnetic moment of the self-pinned emitter is set by the predetermined thickness and composition of the emitter;
wherein the emitter is configured to provide unpolarized electrons to the composite base structure and the composite base structure is configured to polarize the unpolarized electrons injected into the base by the emitter based upon a magnetic orientation of the free layer and the self-pinned layer.

2. The magnetic tunnel transistor sensor of claim 1, wherein the free layer comprises first and second anti-parallel ferromagnetic layers and a coupling layer disposed between the first and second anti-parallel ferromagnetic layers, the first anti-parallel ferromagnetic layer being formed on the spacer layer.

3. The magnetic tunnel transistor sensor of claim 2, wherein maximum collector current is provided when the magnetic orientations of the self-pinned layer and first anti-parallel ferromagnetic layer are substantially parallel.

4. The magnetic tunnel transistor sensor of claim 1, wherein the first and second anti-parallel ferromagnetic layers comprise layers of cobalt iron (CoFe) and the coupling layer comprises a layer of ruthenium (Ru).

5. The magnetic tunnel transistor sensor of claim 1, wherein the self-pinned layer further comprises a layer of nickel iron and cobalt iron form on the collector.

6. The magnetic tunnel transistor sensor of claim 5, wherein collector current is inhibited when a magnetic orientations of the self-pinned layer and first anti-parallel ferromagnetic layer are substantially anti-parallel.

7. The magnetic tunnel transistor sensor of claim 1, wherein the tunnel barrier layer comprises an aluminum oxide ($Al_2O_3$) layer.

8. A magnetic storage system, comprising:
a movable magnetic recording medium;
a magnetic tunnel transistor sensor for detecting magnetic signals on the moveable recording medium; and
an actuator, coupled to the magnetic tunnel transistor sensor, for moving the sensor relative to the medium,
wherein the magnetic tunnel transistor sensor further comprises:
a bottom collector;
a composite base structure formed on the collector, the composite base comprising a spin valve including a self-pinned layer, a free layer and a spacer layer disposed between the free layer and the self-pinned layer;
a tunnel barrier layer formed on the composite base structure; and
a self-pinned emitter formed on the tunnel barrier layer, the emitter having a predetermined thickness and composition, wherein the magnetic moment of the self-pinned emitter is set by the predetermined thickness and composition of the emitter;
wherein the emitter is configured to provide unpolarized electrons to the composite base structure and the composite base structure is configured to polarize the unpolarized electrons injected into the base by the emitter based upon a magnetic orientation of the free layer and the self-pinned layer.

9. The magnetic storage system of claim 8, wherein the free layer comprises first and second anti-parallel ferromagnetic layers and a coupling layer disposed between the first and second anti-parallel ferromagnetic layers, the first anti-parallel ferromagnetic layer being formed on the spacer layer.

10. The magnetic storage system of claim 9, wherein maximum collector current is provided when magnetic orientations of the self-pinned layer and first anti-parallel ferromagnetic layer are substantially parallel.

11. The magnetic storage system of claim 8, wherein the first and second anti-parallel ferromagnetic layers comprise layers of cobalt iron (CoFe) and the coupling layer comprises a layer of ruthenium (Ru).

12. The magnetic storage system of claim 8, wherein the self-pinned layer further comprises a layer of nickel iron and cobalt iron form on the collector.

13. The magnetic storage system of claim 12, wherein collector current is inhibited when magnetic orientations of the self-pinned layer and first anti-parallel ferromagnetic layer are substantially anti-parallel.

14. The magnetic storage system of claim 8, wherein the tunnel barrier layer comprises an aluminum oxide ($Al_2O_3$) layer.

* * * * *